(12) United States Patent
Zhao

(10) Patent No.: US 12,490,382 B2
(45) Date of Patent: Dec. 2, 2025

(54) CORELESS COMPONENT CARRIER WITH EMBEDDED COMPONENTS

(71) Applicant: AT&S Austria Technologie & Systemtechnik Aktiengesellschaft, Leoben (AT)

(72) Inventor: Allen Zhao, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 315 days.

(21) Appl. No.: 18/049,826

(22) Filed: Oct. 26, 2022

(65) Prior Publication Data

US 2023/0128938 A1 Apr. 27, 2023

(30) Foreign Application Priority Data

Oct. 26, 2021 (CN) .......................... 202111248063.5

(51) Int. Cl.
*H05K 1/18* (2006.01)
*H01L 21/48* (2006.01)
(Continued)

(52) U.S. Cl.
CPC ......... *H05K 1/186* (2013.01); *H01L 21/4857* (2013.01); *H01L 21/6835* (2013.01); *H01L 23/3121* (2013.01); *H01L 23/49822* (2013.01); *H01L 23/49838* (2013.01); *H01L 23/49894* (2013.01); *H01L 24/19* (2013.01); *H01L 24/20* (2013.01); *H01L 25/0655* (2013.01); *H05K 1/0366* (2013.01); *H05K 3/4682* (2013.01); *H05K 3/4688* (2013.01);

(Continued)

(58) Field of Classification Search
CPC . H05K 1/186; H01L 21/4857; H01L 21/6835; H01L 23/3121; H01L 23/49822; H01L 23/49838; H01L 23/49894; H01L 24/19
USPC .......................................................... 361/761
See application file for complete search history.

(56) References Cited

U.S. PATENT DOCUMENTS 9,887,167 B1 2/2018 Lee et al.
2010/0120204 A1 5/2010 Kunimoto
(Continued)

FOREIGN PATENT DOCUMENTS

| CN | 113130420 | 7/2021 |
| CN | 113451259 | 9/2021 |
| EP | 3657915 A2 | 5/2020 |

OTHER PUBLICATIONS

Wirner, C.; Extended European Search Report in Application No. 22203833.3; pp. 1-10; Mar. 17, 2023; European Patent Office, 80298, Munich, Germany.

*Primary Examiner* — Binh B Tran
(74) *Attorney, Agent, or Firm* — Robert A. Blaha; Smith Tempel Blaha LLC

(57) ABSTRACT

A coreless component carrier includes (a) a stack with at least one electrically conductive layer structure and at least one electrically insulating layer structure; and (b) a component embedded in the stack. At least one electrically insulating layer structure includes a reinforced layer structure, which is arranged at an outer main surface of the stack. Further described is a method for manufacturing such a coreless component carrier and preferably simultaneously a further coreless component carrier of the same type.

20 Claims, 4 Drawing Sheets

(51) Int. Cl.
*H01L 21/683* (2006.01)
*H01L 23/00* (2006.01)
*H01L 23/31* (2006.01)
*H01L 23/498* (2006.01)
*H01L 25/065* (2023.01)
*H05K 1/03* (2006.01)
*H05K 3/46* (2006.01)
*H05K 3/00* (2006.01)

(52) U.S. Cl.
CPC ............ *H01L 2221/68345* (2013.01); *H01L 2224/19* (2013.01); *H01L 2224/211* (2013.01); *H01L 2224/221* (2013.01); *H05K 3/0035* (2013.01); *H05K 2201/0209* (2013.01); *H05K 2201/0242* (2013.01); *H05K 2203/1476* (2013.01)

(56) References Cited

U.S. PATENT DOCUMENTS

| | | |
|---|---|---|
| 2011/0031606 A1 | 2/2011 | Chen et al. |
| 2011/0155426 A1 | 6/2011 | Park et al. |
| 2015/0062848 A1 | 3/2015 | Lee et al. |
| 2019/0131253 A1* | 5/2019 | Lee .................. H01L 24/19 |
| 2019/0131270 A1 | 5/2019 | Lee et al. |
| 2019/0239362 A1* | 8/2019 | Yang ................ H05K 1/112 |
| 2020/0203185 A1 | 6/2020 | Lee |
| 2020/0203279 A1 | 6/2020 | Ha et al. |
| 2021/0280521 A1 | 9/2021 | Chen et al. |
| 2021/0305154 A1 | 9/2021 | Wang et al. |
| 2022/0270976 A1* | 8/2022 | Sun .................... H01L 24/14 |
| 2022/0302037 A1 | 9/2022 | Chen et al. |
| 2022/0352076 A1* | 11/2022 | Ecton ............... H01L 23/15 |
| 2022/0367373 A1 | 11/2022 | Chen et al. |

* cited by examiner

CORELESS COMPONENT CARRIER WITH EMBEDDED COMPONENTS

CROSS-REFERENCE TO RELATED APPLICATIONS

This application claims the benefit of the filing date of Chinese Patent Application No. 202111248063.5, filed on Oct. 26, 2021, the disclosure of which is hereby incorporated herein by reference.

TECHNICAL FIELD

Embodiments of the present invention relate to an electronic package where a component such as a semiconductor die is embedded within a component carrier made from printed circuit board materials.

BACKGROUND ART

Integrated Circuit (IC) components are accommodated into packages in order to allow for an easy handling and reliable assembly of electronic circuits, e.g., onto a component carrier such as a printed circuit board (PCB). A package for respectively of an integrated circuit further provides protection for the packaged component against, e.g., mechanical and/or chemical impacts.

Continuously improved semiconductor manufacturing procedures for many years yielded a dramatic miniaturization of bare semiconductor chips. Miniaturized semiconductor chips typically comprise within a small area a plurality of contact structures (e.g., Schottky contacts) for electrically connecting the chip to external circuitry. The spatial density of such contact elements may be so high that it is not possible to directly contact such a chip to an external circuitry such as a socket or an arrangement of contact pads formed on a PCB.

In order to facilitate an electric contacting of an integrated circuit chip to external circuitry a so-called interposer can be used. An interposer is an electrical interface spatially routing between one socket or connection to another. The purpose of an interposer is to spread a connection to a wider pitch or to reroute a connection to a different connection.

It is known to integrate an interposing functionality into an electronic package for an electronic chip. However, adding an interposing functionality into an electronic package makes electronic packaging more difficult because additional process steps have to be carried out and controlled in a reliable manner. Further, when manufacturing simultaneously a plurality of thin packages by means of PCB processes, which are carried out on a PCB panel level, there is the risk of an unwanted warpage not only of the entire panel but also of the final component carrier packages which are obtained from the PCB panel by means of a known singularization process.

SUMMARY

There may be a need for providing a component carrier with an embedded component, which can be manufactured in an easy and efficient manner and which, even when being comparatively thin, exhibits a spatial stability being sufficient for further handling and/or processing the component carrier in a reliable manner.

This need may be met by the subject matter according to the independent claims. Advantageous embodiments of the present technology are described by the dependent claims.

According to a first aspect there is provided a coreless component carrier comprising (a) a stack comprising at least one electrically conductive layer structure and at least one electrically insulating layer structure; and (b) a component embedded in the stack. In the described coreless component carrier at least one of the least one electrically insulating layer structures comprises a reinforced layer structure, which is arranged at an outer main surface of the stack.

Overview of Embodiments

The described coreless component carrier is based on the idea that by omitting a core structure the component carrier package with the embedded component can be realized in a compact manner. This holds true in particular for a z- or a vertical direction, which is the thickness direction, i.e., the direction being perpendicular to the planes being defined by the planar extension of the layer structures of the stack. These planes define main surfaces of the component carrier.

In this context it is pointed out that in known component carrier packages a core structure may be any structure which, before performing at least one lamination process of at least partially uncured dielectric material layers in order to produce the (laminated) stack, exhibits a certain mechanical stability. This mechanical stability can be given for instance with a comparatively thick layer of a dedicated dielectric material comprising or consisting of resin, which has undergone already a certain curing resulting in an increased mechanical stability or rigidity.

Due to the mentioned mechanical stability, the occurrence of warpage during processing of the component carrier is reduced. By contrast thereto, during a production of known coreless Printed Circuit Boards (PCBs) it is necessary to consider warpage issues upfront the production and to adapt the process and the materials used accordingly. Under warpage considerations, a production of the described coreless component carrier is easier than a production of known coreless Printed Circuit Boards (PCBs).

For the sake of clarity, it is pointed out that of course the component carrier may comprise, in addition to the described stack with the embedded component also other or further layer structures. For instance, a (further) outer (structured or unstructured) electrically conductive layer structure may have been formed at the outer surface of the reinforced layer structure. Further, in particular, at the mentioned (further) outer electrically conductive layer structure there may have been formed for instance a solder resist layer. This means that in such embodiments the component carrier comprises more layer structures that the layer structures being assigned to the stack.

Before continuing with elucidating the further advantageous embodiments of the present technology in the following paragraphs some general technical considerations about packaging components within PCB component carriers or within PCB component carrier materials will be presented.

In the context of this disclosure the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

The component carrier may be shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. The component carrier is configured as one of the group consisting of a printed circuit board, a substrate (in particular an IC substrate), and an interposer.

In the context of this disclosure, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a PCB, a PCB is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of this disclosure the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a PCB, however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a PCB or intermediate PCB. Thus, the term "substrate" also includes "IC substrates". A dielectric part of a substrate may be composed of resin with reinforcing particles (such as reinforcing spheres, in particular glass spheres). The substrate or interposer may comprise at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

The at least one electrically insulating layer structure may comprise at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), polyvinylidene fluoride (PVDF), a ceramic, and a metal oxide. Teflon® is a registered mark of The Chemours Company FC LLC of Wilmington, Del., U.S.A. Reinforcing structures such as webs, fibers, or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

The at least one electrically conductive layer structure may comprise at least one of the group consisting of copper, aluminum, nickel, silver, gold, palladium, tungsten, silicon, tin, lead, chromium, platinum, titanium, cobalt, rhenium, and iridium. Although copper is usually preferred, other materials or coated versions thereof are possible as well, in particular materials coated with a supra-conductive material such as graphene.

The (embedded) component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, also other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. Moreover, also other components, in particular those which generate and emit electromagnetic radiation and/or are sensitive with regard to electromagnetic radiation propagating from an environment, may be used as a component.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier. In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of the component carrier. If such exposed electrically conductive layer structures are left unprotected, then the exposed electrically conductive component carrier material (in particular copper) might oxidize, making the component carrier and its electric functionality less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold), etc.

According to an embodiment the coreless component carrier comprises a further electrically conductive layer structure, which is formed at an outer main surface of the component carrier. The further electrically conductive layer structure comprises embedded conductor traces formed within a layer of insulating material. This may provide the advantage that a formation of a potentially outermost patterned or structured conductive layer, which may be used for connecting the described component carrier with external circuitry or further build-up structures, can be realized in a simple and effective manner. In particular it is not necessary to form a patterned electrically conductive layer structure with several known process steps solely for providing an electric interface to other circuitry.

In this context it is mentioned that embedded conductor traces can be provided by means of a so-called Embedded Trace Structure (ETS), which itself is based on a well-known and well approved technology for building up a circuit pattern within a surrounding electrically insulating material. An ETS has a coreless structure, which allows for the implementation of so called "microcircuits" without the need for additional process steps and costs.

According to a further embodiment the coreless component carrier further comprises tapering electrically conductive through connections formed in the stack. The tapering electrically conductive through connections have been formed both above and below the component, which means that along the vertical direction there are provided tapering electrically conductive through connections at both sides of the component. The at least one tapering electrically conductive through connection above has the same tapering direction as the at least one tapering electrically conductive through connection below the component.

In this document the term "tapering electrically conductive through connections" may particularly mean any (vertically extending) electrically conductive structure which comprises at least one portion or section within which along the vertical direction a cross section of the structure monotonically increases or decreases. In other words, within the mentioned portion or section and along the vertical direction the electrically conductive structure becomes either thicker or thinner, depending on the particular direction (vertically upwards or vertically downwards).

It is pointed out that there may be given a plurality of different portions or sections which individually fulfill the above described "tapering feature". However, it is possible that between two following portions or sections there may be a cross sectional change in the opposite direction. Thereby, this change may be, in particular, a step wise change wherein within and along the respective portion or section the thickness variation is continuous. Specifically, the tapering electrically conductive through connections may be realized by a structure which comprises a stack of truncated cones, which all have the same tapering direction. Thereby, one truncated cone corresponds to one portion or section of the entire structure.

It is mentioned that the "truncated cone shape" may be of high importance for the described component carrier because the cone shape is a typical shape which is related to a formation of vias by means of laser radiation (laser drilling). This means that the same tapering direction of all portions or sections of the structure of the "tapering electrically conductive through connections" reflects the "processing direction" of the involved laser drilling processes.

According to a further embodiment the embedded component extends in a vertical direction over a plurality of electrically insulating layer structures. Thereby, some of the plurality of electrically insulating layer structures may be assigned to the stack and others may be external from the stack. This may provide the advantage that the described coreless component carrier can be realized with different embedded components which have different thicknesses along a vertical direction. Hence, the concept of the described coreless component carrier can be employed for a variety of different embedded components, which may be usable for different fields of application.

The mentioned vertical direction may be in particular the direction perpendicular to the planar extension of the layer structure of the stack. In other words, the normal vector of the layer planes of the stack are parallel to the vertical direction.

According to a further embodiment the coreless component carrier further comprises a continuous metal structure formed below the embedded component.

During operation of the coreless component carrier respectively of its embedded component the described continuous metal structure may improve the heat transport away from the component. Specifically, the generated heat, even when being generated in at least one small subregion of the embedded component, can be spatially distributed in an effective manner. It should be clear that a spatially distributed amount of heat can be dissipated easier and without the risk of causing thermal damage than a spatially concentrated heat amount.

It is pointed out that such a continuous metal structure might be formed in different shapes, in order to increase the surface area and thereby increase the heat removal capacity. The surface area may be increased for instance with a three dimensionally shaped upper surface of the continuous metal structure. Such a surface may comprise for instance parallel stripes with alternating (i) elevated surface portions and (ii) recessed surface portions. Instead of stripes also elevated surface portions may be provided, which form a meander type structure, a rectangular type structure, a spiral type structure or even a circular type structure.

In some applications the described continuous metal structure can be used or act, during operation, as a shielding structure. In particular, electromagnetic radiation can be shielded away from the interior of the coreless component carrier. This may provide the advantage that the electromagnetic compatibility (EMC) of an electronic assembly formed with, at, on and/or within the described component carrier can be increased.

According to a further embodiment the continuous metal structure comprises at least one horizontal portion and/or at least one vertical portion. This may provide the advantage that the above-described shielding can be realized in three dimensions. Thereby, a horizontal layer portion can be realized with a usual horizontal layer. A vertical portion can be realized for instance with a metallized via and/or a metallized vertical trench.

Further, the continuous metal structure can be located on or at different layer levels. This may be of advantage for instance if two components with different heights are embedded.

For the sake of clarity, it is pointed out that the mentioned horizontal portion extends along a horizontal plane, which in the usual orientation of the component carrier is parallel to the above-described main surface. Correspondingly, the mentioned vertical portion extends within a plane being perpendicular to the main surface.

According to a further embodiment contact terminals of the embedded component are in direct contact with the electrically conductive layer structure. This may allow to electrically contact the embedded component in a simple and effective manner. Specifically, vertically extending electrically conductive elements such as metallized vias or pillars are not needed. Hence, in this embodiment the term "in direct contact" may be understood both as in direct electric and in direct mechanical contact without requiring any intermediate contact element or contact structure.

In this context a direct contact may mean that the contact terminals, which also may be pads, are located at the same layer or height level as the electrically conductive layer structure. This can be realized for instance by using a Photo Imageable Dielectric (PID) layer for encapsulating the embedded component. Alternatively, sputtering technique can be used in order to form the contact terminals and the electrically conductive layer structure at or within the same layer.

According to a further embodiment the coreless component carrier further comprises a fan out structure formed at one side of the embedded component. Providing the described fan out structure may allow to realize, in a simple and effective manner, an electric contacting of the embedded component. This may be of benefit in particular for highly integrated components, e.g., a ball grid array, which comprise a plurality of small contact terminals within a small spatial region.

According to a further embodiment the coreless component carrier further comprises a further fan out structure formed at one further side of the embedded component. The "one further side" of the embedded component may be in particular opposite to the above mentioned "one side". This means that both above and below the embedded component there is provided respectively one fan out structure. Hence, the embedded component can be electrically connected from all sides. This "all side connection possibility" may provide the advantage that the freedom of design for the electric circuitry respectively for the electric wiring within the interior of the described coreless component carrier can be increased. This may contribute to (further) increase of the integration density of electric circuits which are build up with the described coreless component carrier.

According to a further embodiment the fan out structure and/or the further fan out structure comprises a photoimageable dielectric material. This may provide the advantage that the respective fan out structure can be realized with a simple and effective process. Specifically, it is not necessary to form/process different structured electrically conductive layers. Instead, the photoimageable dielectric (PID) material can be structured in three dimensions by means of a per se known photoimaging processes with electromagnetic radiation, in particular UV radiation, which is spatially structured with a mask.

According to a further embodiment the stack is free of a core. Omitting a core (structure) may allow to realize the described coreless component carrier (together with the embedded component) within a flat respectively a thin design. Hence, the integration density of an electronic package comprising the embedded component can be increased also with regard to the vertical direction. Hence, several packaged components can be stacked in a spatially compact manner.

In this context it is mentioned that in some applications it might be necessary to avoid unwanted warpage, which could generally be an issue with known coreless PCB. This warpage issues can be resolved by applying a so called "2.5D technology" for embedding the component. By contrast to usual embedding, which is done within a core using a sticky tape as supporting structure, the 2.5D technology uses an intermediate release layer in order to remove a layer part above the release layer after this part has been cut out (down to the release layer), e.g., by means of depth-controlled laser cutting. The accordingly removed layer part results in a cavity into which the component can be placed. Preferably, with the described 2.5D technology the respective dielectric layer structure will be cured (at least 80% cured) before cutting out the layer part for forming the cavity.

According to a further embodiment at least one buildup layer formed at one side of the component. The described at least one buildup layer may provide some mechanical protection for the embedded component which may make the embedding of the component more reliable and stable. Hence, the described component carrier concept is also suitable to manufacture asymmetric buildups without suffering (too much) from warpage issues.

Further, the at least one buildup layer may allow to extend the electric wiring pattern within the interior of the described coreless component carrier. This holds true if the at least one buildup layer comprises an appropriately patterned electrically conductive layer structure and/or allows to form or attach such an appropriately patterned electrically conductive layer structure at a surface of the at least one buildup layer. Hence, the circuitry within the described coreless component carrier can be extended which may allow to electrically connect a further component increasing the entire electric functionality of the described coreless component carrier. Thereby, the further component may be a further embedded component or a surface mounted component. Of course, the different patterned electrically conductive layer structures may be interconnected with each other in an appropriate manner for instance by employing known vertical via connections.

In this context the term "one side of the component" may be understood as either an upper side or a lower side of the embedded component, wherein "upper" and "lower" refers to the vertical direction/thickness direction, i.e., the direction being perpendicular to the planes being defined by the planar extension of the layer structures of the stack.

According to a further embodiment at least one of the at least one build-up layer comprises reinforcing particles. This may provide the advantage that the mechanic stability of the described coreless component carrier can be (even more) increased. The reinforcing particles may be for instance glass spheres or fibers.

According to a further embodiment the coreless component carrier further comprises at least one further buildup layer formed at one another side of the component, wherein the one another side of the component is opposing to the one side of the component. This may allow to further improve the mechanical stability/embedding and/or to further increase the electric wiring pattern within the interior of the described coreless component carrier.

It is pointed out that in accordance with the above-mentioned (at least one) buildup layer also the (at least one) further buildup layer may comprise reinforcing particles such as glass spheres and/or fibers.

According to a further embodiment the coreless component carrier further comprises at least one further embedded component. Packaging respectively embedding a further component may allow to increase the electric functionality of the described coreless component carrier.

According to a further embodiment the embedded component and the further embedded component have different thicknesses.

The described allowability of the embedded components to have different thicknesses may increase the suitability of the described coreless component carrier for a variety of different applications which may require different types of chips to be embedded in a compact and reliable manner. Thereby, the different components may be embedded within different layer structures of the stack. Thereby, the "embedding layer structures" may be different with respect to the individual layers and/or with respect to the number of layers.

The process for embedding components of different heights and forming appropriate shaped and dimensioned cavities can be realized in an effective manner by using the already above described 2.5D technology. With this technology, a use of pre-cut prepregs (non-fully hardened) is avoided, enabling for the embedding of components of different heights in a more reliable way. Additionally, a very thin encapsulation layer may be used to encapsulate the component and to manufacture, e.g., the above-described fan-out structure. It is mentioned that with this technology no additional planarization step is needed in order to planarize the layer above the embedded component.

According to a further aspect there is provided a method of manufacturing a coreless component carrier. The provided method comprises (a) providing a stack comprising at least one electrically conductive layer structure and at least one electrically insulating layer structure; and (b) embedding a component in the stack. According to this further aspect, at least one of the least one electrically insulating layer structures comprises a reinforced layer structure, which is arranged at an outer main surface of the stack.

Also, the described method is based on the idea that by omitting a core structure, which is given in the (finally) manufactured component carrier package, allows to realize the coreless component carrier in a spatially compact manner.

It is pointed out that for connecting the embedded component with conductor structures formed within the stack it is possible, however not required, to use per se known via connections. It is further possible to realize via-less connections by using electric conductors formed within a PID layer or a more or less direct electric connection with a sputtered metal in order to obtain a via-free connection between the embedded component and the stack. The concept of "PID" and "sputtering" have already been described above and will not be repeated here.

According to an embodiment the method further comprises forming a further electrically conductive layer structure at an outer main surface of the component carrier, wherein the further electrically conductive layer structure comprises embedded conductor traces formed within a layer of insulating material. As has already been mentioned above, the described "embedded conductor trace" approach may allow for realizing an electric interface to and/or from other electric structures in a simple and effective manner.

According to a further embodiment there is formed an embedded trace structure comprising the embedded conductor traces with a Detachable Copper Foil (DCF), wherein during formation of the embedded trace structure the detachable copper foil together with reinforced dielectric layer acts as a temporary carrier structure. This may provide the advantage that the embedded conductor traces can be realized with a simple and reliable process. Further information regarding the DCF will be given below.

According to a further embodiment the method further comprises forming a continuous metal structure layer at the bottom of a cavity wherein the embedded component is to be accommodated. As has already been mentioned above, the described continuous metal structure layer may make a significant contribution to a heat transport away from the embedded component, when the coreless component carrier respectively the embedded component is in operation.

According to a further embodiment for a formation of the cavity the continuous metal structure layer acts as a stop layer for electromagnetic radiation removing material from the cavity region. This may provide the advantage that the cavity can be formed in an easy and precise manner.

The described "stopping functionality" of the continuous metal structure layer may be based in particular on the ability that the metallic surface of the continuous metal structure layer reflects the electromagnetic radiation. Depending on the specific application and in particular on the employed dielectric materials the electromagnetic radiation may comprise infrared (IR), visible, and/or ultraviolet (UV) spectral radiation components.

According to a further embodiment the method comprises simultaneously manufacturing a further coreless component carrier by employing a temporary support structure having two opposing main surfaces. Thereby, the coreless component carrier is manufactured at one main surface of the two opposing main surfaces and the further coreless component carrier is manufactured at the other main surface of the two opposing main surfaces.

Providing the temporary support structure as an interim support structure for manufacturing/forming the two above-described coreless component carriers may allow to significantly improve the manufacturing process. This may hold true not only for the productivity of the number of (simultaneously) manufactured coreless component carriers but also for the implementation of the manufacturing process. In this context it should be easily understood that the temporary or interim support structure allows to spatially support the two stacks in a reliable manner. This may be of benefit in particular when at least at the beginning of the described method dielectric layers of the stack are not yet cured.

With the described method the two component carriers may stabilize each other during production. This can easily be understood since a thicker panel leads to more mechanical stability. A contribution to the mechanical stability may also be given by using a reinforced dielectric layer structure at the outermost side of the respective layer build-up together with a so-called detachable copper foil (DCF) as a (further) supporting structure during processing.

In this context it is mentioned that a per se known DCF comprises a resin with a release layer and, on top of the release layer a detachable continuous copper foil. This copper foil acts as a seed layer to form a patterned plated copper structure for realizing connection pads. After the formation of the patterned plated copper structure the seed layer copper foil is etched or grinded in lateral regions other that the regions onto which the patterned plated copper structure has been formed.

Simultaneously, the DCF may be used to form an ETS on the main surface of each build-up and enables the production of two component carriers at the same time. Hence, the use of the above described 2.5D technology in combination with the DCF enables for the manufacturing of reliable and thin component carriers with a comparatively small warpage. Due to the simultaneous production of two coreless component carriers at the same time, the production yield is doubled.

The temporary support structure may be a core made from or comprising a resin material, which has been hardened at least partially. Preferably, before the temporary support structure is used as a mechanical support, the resin material has been cured completely. However, also a partially cured structure can be used as the temporary support structure.

In other words and in more detail, it is pointed out that the temporary support structure (TSS) may have two functions for the described manufacturing process. A first function is, as has already been described above, the mechanical support during the manufacturing process which may make a contribution to a low warpage of the finally manufactured coreless component carrier. A second function of the TSS may be that it can act as a temporary carrier structure at which the above described ETS can be (pre)formed. After the use of the TSS, when the coreless component carrier and the further coreless component carrier are separated from the TSS, the ETS stays with the respective coreless component carrier. Thereby, the "staying" at the respective coreless component carrier can be facilitated in a known manner with the assistance of a suitable release layer in between the ETS and the TSS.

According to a further embodiment an intermediate processing structure comprising (i) the coreless component carrier, (ii) the temporary support structure, and (iii) the further coreless component carrier exhibits a symmetry with respect to a center plane of the temporary support structure.

The described symmetric processing may provide the advantage that mechanical stress, which may occur during different phases or stages of the manufacturing process, can be compensated at least partially. This is because the two portions of the intermediate processing structure, which are located at opposite sides of the temporary support structure, may have opposed stress directions which compensate each other at least partially.

According to a further embodiment an intermediate processing structure comprising (i) the coreless component carrier, (ii) the temporary support structure, and (iii) the further coreless component carrier exhibits an asymmetry with respect to a center plane of the temporary support structure. Allowing the intermediate processing structure to have an asymmetric design may improve the freedom of design of the described coreless component carrier having at least one embedded component.

According to a further embodiment the temporary support structure comprises a release material formed at least at the two opposing main surfaces. The release material may be provided as a release layer, which itself is well known in the field of PCB technology.

The described provision of the release material (layer) may facilitate a separation of the coreless component carrier and of the further coreless component carrier from the temporary support structure. Specifically, the corresponding separation process may be accomplished without damaging the two coreless component carriers in any way.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present technology are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
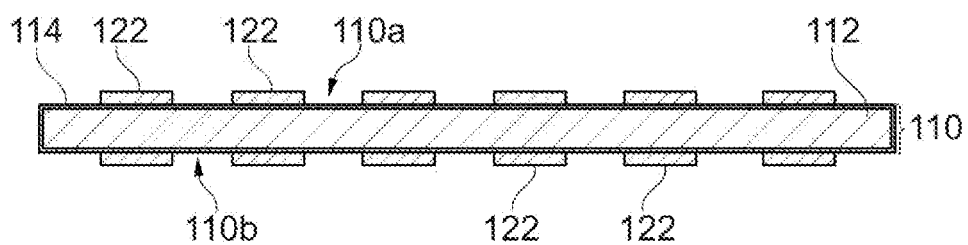
FIG. 1, FIG. 2, FIG. 3, FIG. 4, FIG. 5, FIG. 6, FIG. 7, and FIG. 8 illustrate a manufacturing process for two coreless component carriers being formed at opposite sides of a temporary support structure.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element(s) as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment can assume orientations different than those illustrated in the Figures when in use.

FIGS. 1 to 8 show the intermediate products which are produced during a manufacturing process for two coreless component carriers being formed at opposite sides of a temporary support structure.

FIG. 1 shows the start of the manufacturing process, wherein a temporary support structure 110 is provided. According to the exemplary embodiment described here the temporary support structure (TSS) 110 comprises a reinforced dielectric layer 112, which is made at least partially from an at least partially cured resin material. In some other applications, an uncured structure can be used as the reinforced dielectric layer 112. Hence, the reinforced dielectric layer 112 is a comparatively stable and rigid structure, which provides a mounting base for subsequent process steps. The reinforced dielectric layer 112 comprises two opposing main surfaces, an upper surface denominated with reference numeral 110a and a lower main surface denominated with reference number 110b.

According to the embodiment described here the temporary support structure 110 is coated with a release layer 114. The release layer 114 is made from a material known in printed circuit board (PCB) manufacturing technology and allows, at a later processing stage, an easy and reliable separation from not depicted layer structures which are later formed at the two opposing main surfaces 110a and 110b.

According to the embodiment described here, there are further provided conductive pads 122 both at the upper main surface 110a and at the lower main surface 110b. These pads 122, which are made from a metallic material such as copper and which are formed in a known manner, represent elements of the two final coreless component carriers which will be manufactured.

It is pointed out that the conductive pads 122 can be any electrically conductive structures which are suitable to allow for an electric connection with another (patterned) electrically conductive structure. Such another (patterned) electrically conductive structure may be for instance (i) a terminal of a component or (ii) a conductive layer structure, e.g., a copper conductor trace, of another build up layer structure.

It is further pointed out that according to the exemplary embodiment described here entire structure shown in FIG. 1 is a semifinished product. During production of this semifinished product the reinforced dielectric layer 112 (together with the release layer 114) acts as a carrier for a so-called Detachable Copper Foil (DCF). The DCF itself is no more shown in FIG. 1. As has already been mentioned above, the DCF acts as a seed layer to form a patterned plated copper structure. After the formation of the patterned plated copper structure this seed layer is etched or grinded away in lateral regions other that the regions onto which the patterned plated copper structure has been formed.

In some embodiments the structure shown in FIG. 1 is an Embedded Trace Structure (ETS). This means that it is not necessary to apply a solder resist layer, because the traces of the conductive pads are only minorly exposed to the environment.

Figure 8:
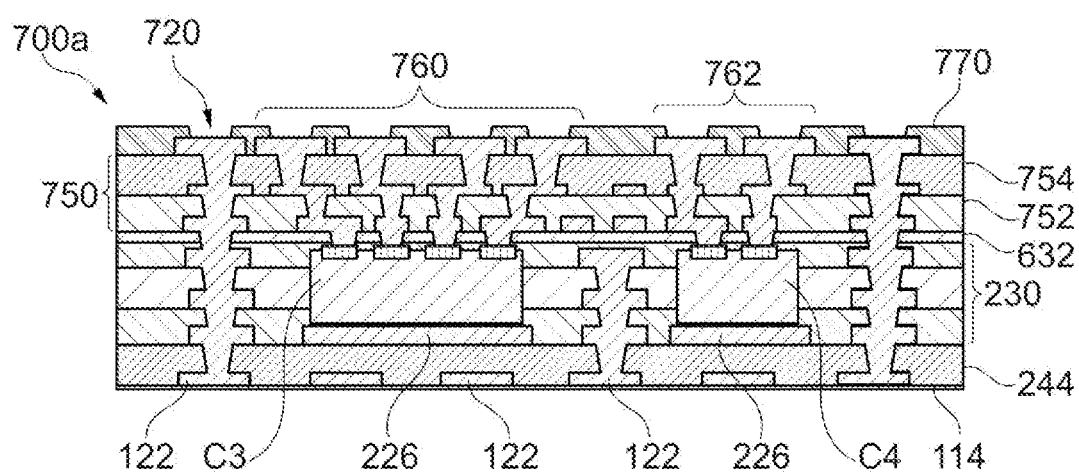

It is further pointed out that by manufacturing the patterned plated copper structure for realizing connection pads already at this very early process step, no etching step for a removal of the remaining seed layer is needed before in a later process step two manufactured coreless components are detached from the TSS 110 (see FIG. 8 showing only one of the two detached coreless component carriers). By this manner, the Line Space (L/S) ratio can be improved, and the reliability of the whole build-up is improved as well.

Figure 2:
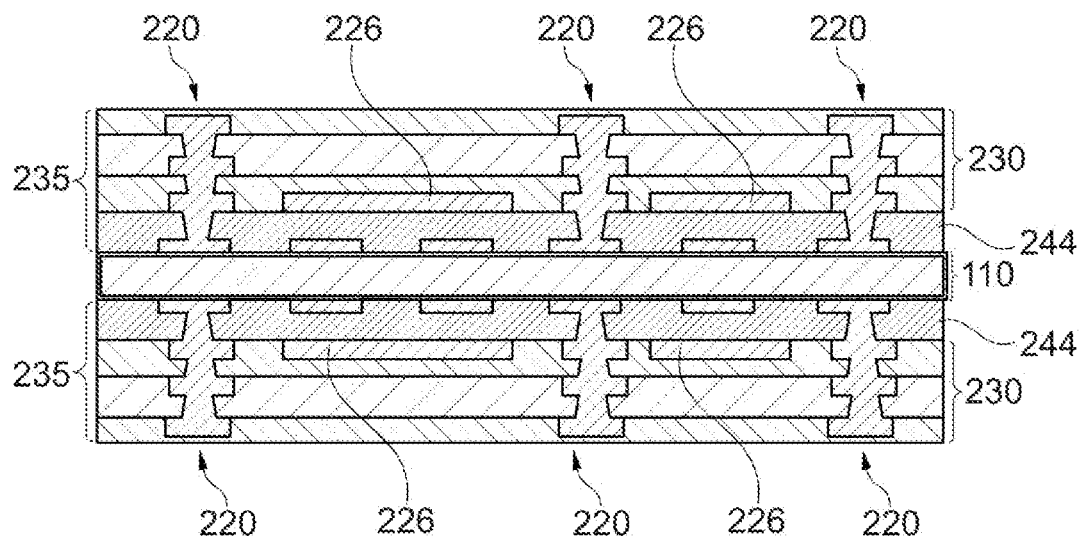

FIG. 2 shows the intermediate structure resulting from several further per se know processing steps. Both at the upper main surface 110a and at the lower main surface 110b there has been formed respectively one sequence 235 of various layer structures. According to the exemplary embodiment described here this layer structure sequence 235 comprises a so-called embedded trace layer structure 244 and a stack 230 comprising several dielectric layers with respectively a non-depicted electrically conductive (metallic) layer structure in between two neighboring dielectric layer structures. In the embodiment shown in FIG. 2 the stack 230 comprises three dielectric layers.

It is pointed out that in other non-depicted embodiments the embedded trace layer structure 244 may also form at least a part of the stack.

Further, there are formed several electrically conductive through connections 220 which extend from respectively one of the pads 122 to the most outer dielectric layer structure of the respective stack 230. Each one of the electrically conductive through connections 220 comprises several metallized vias which each have a tapering shape. This tapering shape results from the employed via formation process, which is/was a usual laser drilling process. Since the laser drilling direction is the same for all electrically conductive through connections 220 being formed within one and the same layer structure sequence 235, the metallized vias of each tapering electrically conductive through connection 220 have the same tapering direction. Specifically, the vias taper in the direction towards the (inner) temporary support structure 110. In between two vias there is formed, in a known manner, a metallic pad. For easy of illustration neither the individual vias nor these metallic pads are denominated with reference numbers.

Furthermore, as can be taken from FIG. 2, for each one of the two layer structure sequences 235 there are/have been formed two comparatively large metal layer structures 226, which in this document are denominated continuous metal layers 226. In the vertical direction these continuous metal layers 226 are formed in between the embedded trace layer structure 244 and the adjacent stack 230. In the horizontal direction these continuous metal layers 226 are formed in between two tapering electrically conductive through connections 220.

As can be easily seen from FIG. 2, the entire intermediate layer structure exhibits a symmetry with respect to (a center line/center plane of) the temporary support structure 110.

This has the effect that during the various process steps mechanical stress, caused for instance due to terminal effects, in particular different coefficients of thermal expansion of different materials, will occur in a symmetric manner. Hence, there will be minimized unwanted warpage effects.

Figure 3:
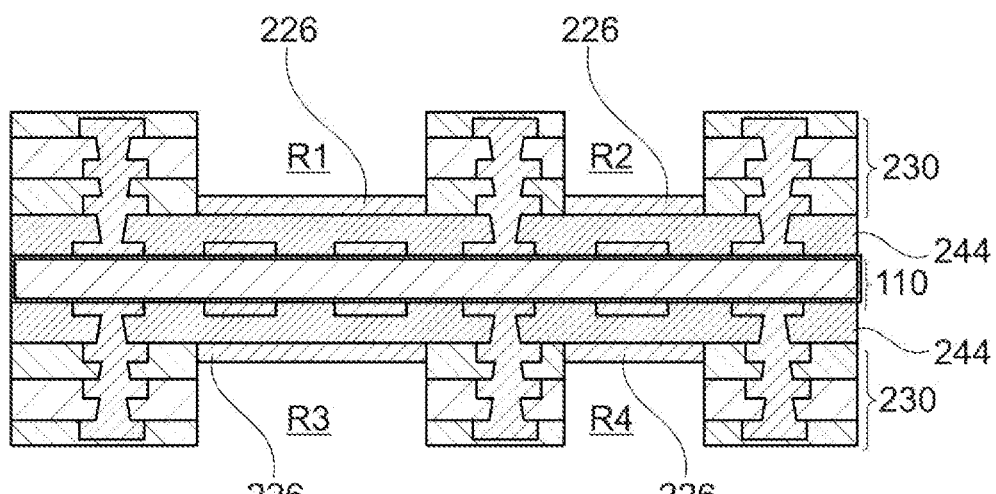

As can be taken from FIG. 3, in next processing steps cavities of recesses R1, R2, R3, and R4 are formed above respectively below the continuous metal layers 226. The formation of these recesses R1-R4 can be realized in any known manner, for instance with appropriate etching and/or (laser) cutting procedures. When using a laser cutting procedure a not depicted further release layer can be provided above each one of the continuous metal layers 226. Such a release layer may allow for an easy removal or take out of a laser cut block corresponding to respectively one of the recesses R1-R4.

Figure 4:
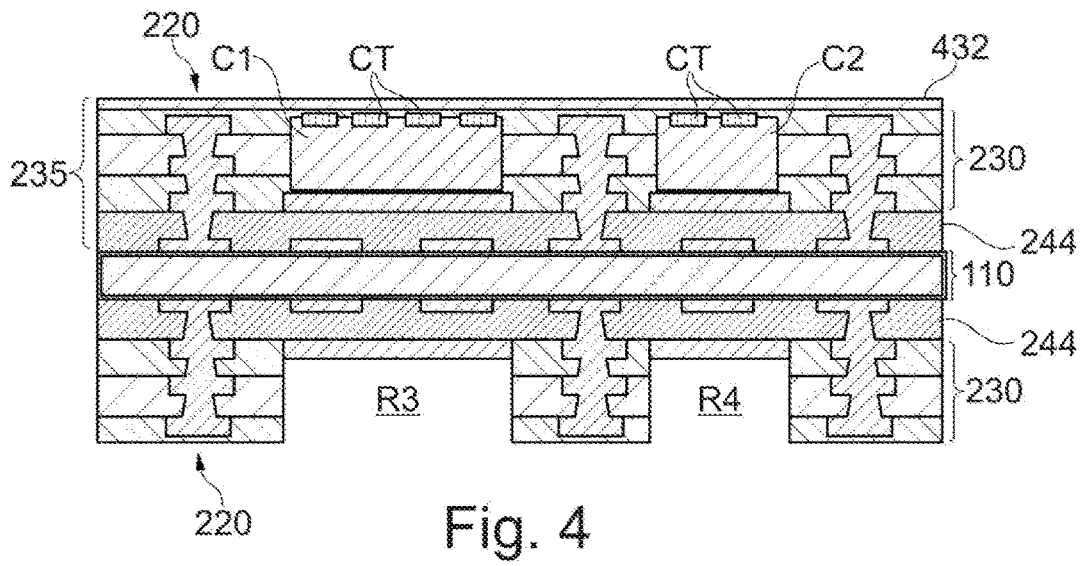

After some next processing steps, the results of which are shown in FIG. 4, there are placed two (electronic) components or dies C1 and C2 within the two upper recesses R1 and R2, respectively. Each one of the components C1 and C2 comprises, at its upper surface, several contact terminals CT. Further, on top of the upper layer structure sequence 235 there is formed a (further) dielectric layer 432.

Figure 5:
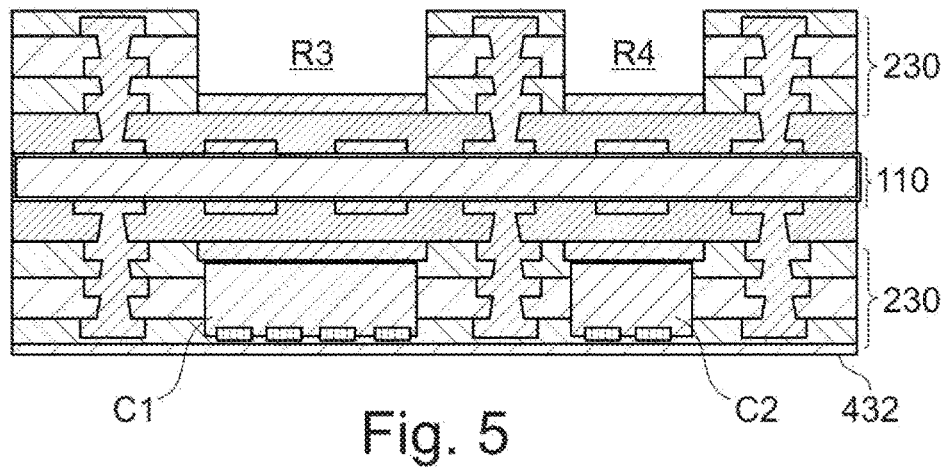

Next, as can be taken from FIG. 5, the intermediate structure shown in FIG. 4 is flipped. Hence, the recesses R3 and R4 are located above the embedded components C1 and C2, respectively. No further process steps have been carried out up to now.

Figure 6:
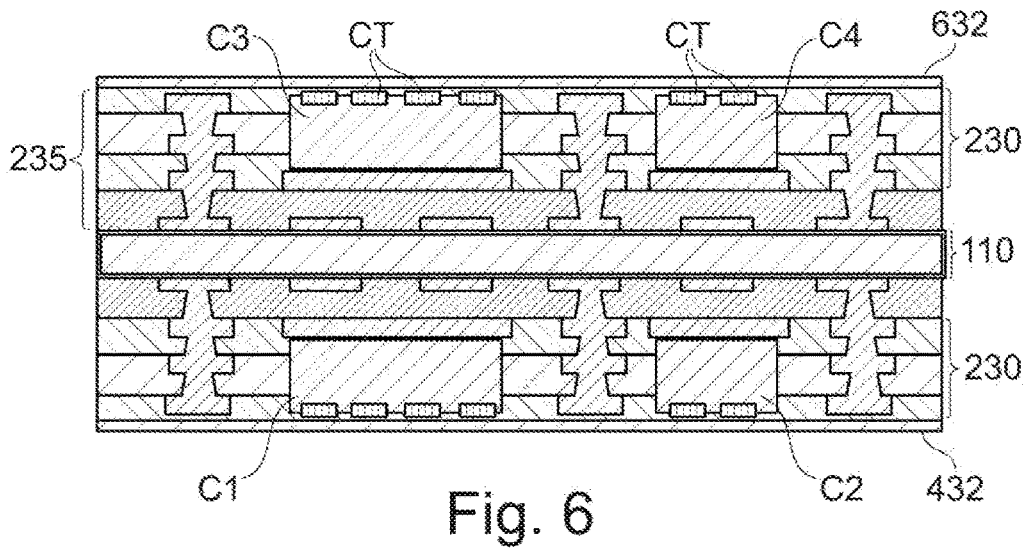

After some next processing steps, the results of which are shown in FIG. 6, there are placed two further (electronic) components or dies C3 and C4 within the two recesses R3 and R4, respectively. Again, each one of the components C3 and C4 comprises, at its upper surface, several contact terminals CT. Further, on top of the now upper layer structure sequence 235 there is formed a (further) dielectric layer 632. It is pointed out that this (further) dielectric layer 632 is thinner as compared to the other dielectric layers and is referred to as encapsulation layer. As it is thinner, it is easier to manufacture a fan-out structure because there is less material to be drilled for connecting the pads onto the component's surface). Alternative to a such thin (further) dielectric layer 632 the use of a PID layer would be possible.

As has already been mentioned above in the general description, the cavity accommodating the components C1, C2, C3, C4 may have been formed using the above described 2.5D technology. This allows to manufacture the cavity after the (reinforced) dielectric layer structures have been cured. Thereby, the curing may be done in two steps. First, up to 80% of the resin will be cured to avoid slipping of the individual layers. This happens after generating the structure shown in FIG. 2 and before the cavity will be manufactured. The second curing step will be done after the structure shown in FIG. 6 has been manufactured. After the second curing step, all dielectric layer, so far applied, will be fully cured. Thus, the overall accuracy of the process will be increased.

Figure 7:
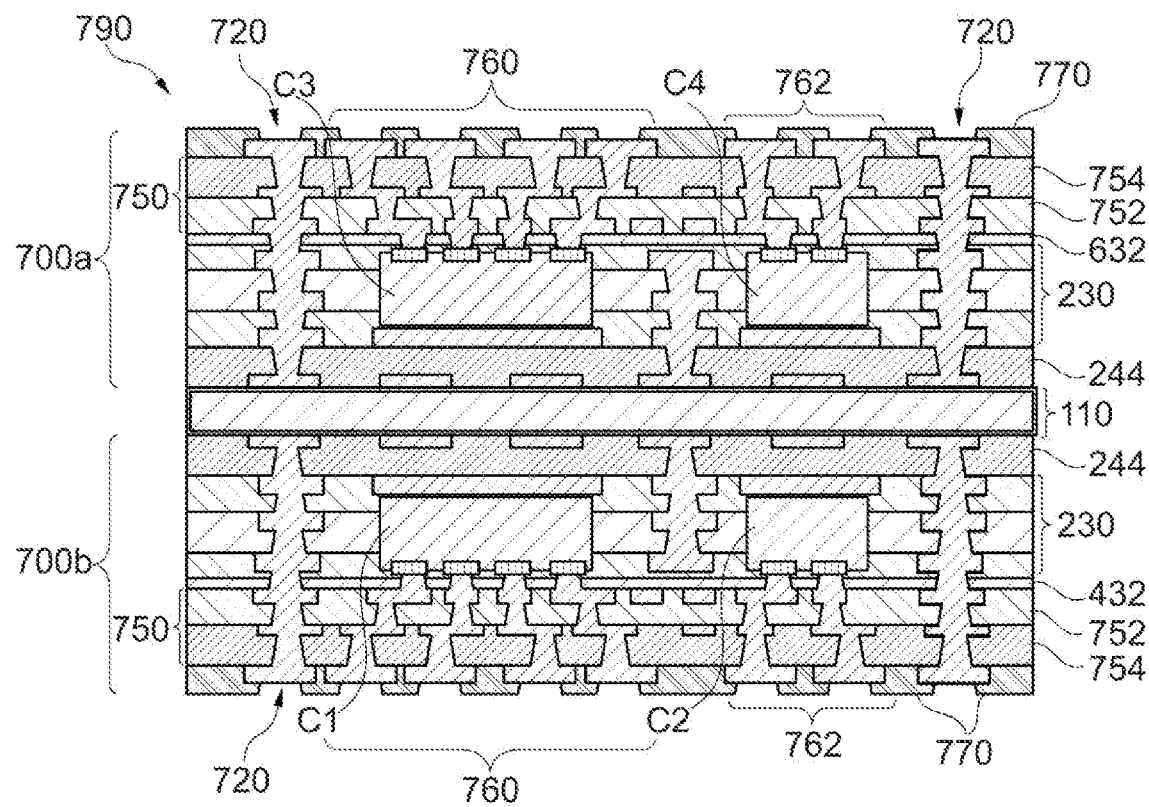

FIG. 7 shows an (extended) intermediate processing structure 790 which is the result of several process steps which are each (per se) known by persons skilled in PCB processing technology. Specifically, on top of the dielectric layer structure 632 there is formed a buildup layer structure 750, which comprises a further dielectric layer 752 and a further embedded trace layer 754. Further, the tapering electrically conductive through connections 220 are extended upwards through the dielectric layer 752 and the embedded trace layer structure 754. The corresponding extended tapering electrically conductive through connections are denominated with reference numbers 720.

Further, above the embedded component C3 there is formed a fan out structure 760, which comprises several metallized vias and metallic pads. The structure, the processing, and the function of such a fan out structure 760 is per se known to the skilled person and will not be elucidated here in in order to keep the volume of this document within acceptable limits. Also, the different elements of the fan out structure 760 are not denominated with reference numbers for ease of illustration. A (smaller) fan out structure 762 is formed above the embedded component C4.

Furthermore, above the further embedded trace layer 754 there is formed a (solder resist) surface finish layer 770. Appropriate openings are formed within this layer 770 in order to allow electrically contacting the embedded components C3 and C4 by means of the fan out structures 760 and 762, respectively. Such a surface finish layer 770 is well known to the person skilled in the art and will not be elucidated in this document.

The entire structure formed above the temporary support structure 110 is already a coreless component carrier 700a in accordance with an embodiment described in this document.

As can be taken from FIG. 7, also the (extended) intermediate processing structure 790 is symmetric with respect to the center plane of the temporary support structure 110. Hence, in FIG. 7 below this temporary support structure 110 there is formed the same coreless component carrier, which is denominated with reference number 700b.

In a next processing step, the result of which is shown in FIG. 8, the two coreless component carriers 700a and 700b are removed from the temporary support structure 110. Thereby, benefit is taken from the above-described release layer 114, which allows for an easy and reliable separation. For the ease of illustration in FIG. 8 only the (upper) coreless component carrier 700a is depicted. At the bottom of the coreless component carrier 700a, residues of the release layer 114 can be seen. These release layer residues 114 are removed, for instance by means of an appropriate cleaning and/or etching process, within a next and not further elucidated processing step.

It is pointed out that an important feature of the embodiment described here is that the most outer layers 244 and 754 are based on a reinforced dielectric layer, having reinforcing structures, such as glass fibers or spheres. The resin of the layer 244 may fill up recesses between the embedded pads 122. The same may hold true for the resin of the layer 754, which may fill up recesses between the embedded pads, which are given in the layer 754 and which are not denominated with reference numerals in FIG. 8. Further, as has been described above, the embedded pads 244 have been formed with the help of a DCF yielding, e.g., the ETS 244. Thus, in the embodiment described here only the outermost layers are reinforced layers 244 and 754 and are responsible for mechanically stabilizing the build-up after detaching it from the TSS.

It may be possible that reinforcing particles such as glass spheres of the outermost layers 244 and 754 will accumulate on top of the respective embedded trace, as they might not fit into the recess between the traces. By reinforcing the outermost layers, the young modulus of the buildup can be doubled. With this manner, it is possible to manufacture very thin component carriers having nevertheless an adequate mechanical stability. Even asymmetric build-ups with a reduced warpage behavior are feasible.

Figure 9A:
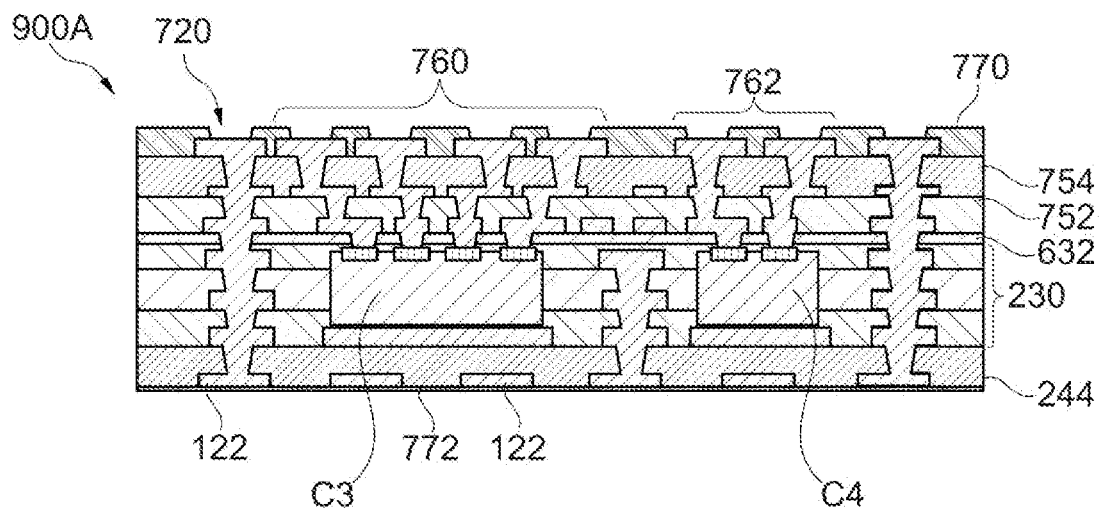
FIG. 9A and FIG. 9B show coreless component carriers in accordance with embodiments of the present technology.

FIG. 9A shows a final coreless component carrier 900A in accordance with a first option. An Organic Solderability Preservative (OSP) layer 772 is applied at the bottom of the coreless component carrier 900A, which in a known manner protects in particular the (copper) metal pads 122 and which further allows for an easy and reliable electrical connection of the embedded components C3 and C4 with external circuitry also from the bottom side of the coreless component carrier 900A.

Figure 9B:
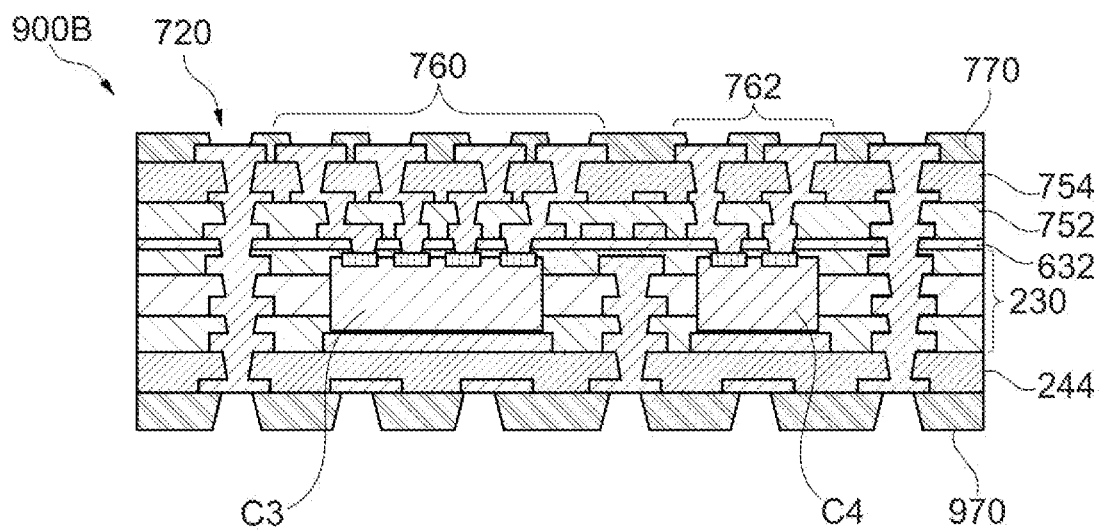

FIG. 9B shows a final coreless component carrier 900B in accordance with a second option. Here, instead of the OSP layer a further (solder resist) surface finish layer 970 is applied. Appropriate openings are formed within this layer in order to allow for an electrical connection of the embedded components C3 and C4 with external circuitry also from the bottom side of the coreless component carrier 900B.

It is mentioned that in other non-depicted embodiments, the at least one embedded component comprises contact terminals both at its upper and at its lower main surface. Hence, in such embodiments of a coreless component carrier at least one further fan out structure can be used in order to allow for an easy and reliable contacting of the respective component also from the other side.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

LIST OF REFERENCE SIGNS 110 temporary support structure (TSS)
110a/b opposing main surfaces
112 reinforced dielectric layer
114 release layer
122 pads
220 tapering electrically conductive through connections
226 continuous metal layer
230 stack
235 layer structure sequence
244 embedded trace (layer) structure/further buildup layer structure
R1-R4 recesses/cavities
432 dielectric layer
C1, C2 (embedded) components
CT contact terminals
632 dielectric layer
C2, C4 further (embedded) components
700a coreless component carrier
700b further coreless component carrier
720 extended tapering electrically conductive through connections
750 buildup layer structure
752 dielectric layer
754 embedded trace layer structure
760 fan out structure
762 fan out structure
772 Organic Solderability Preservative (OSP) layer
770 (solder resist) surface finish layer
790 intermediate processing structure
900A coreless component carrier
900B coreless component carrier
970 (solder resist) surface finish layer

The invention claimed is:

1. A coreless component carrier, comprising:
    a stack comprising at least one electrically conductive layer structure and several electrically insulating layer structures;
    a component embedded in the stack;
    wherein at least one of the electrically insulating layer structures, which is arranged at an outer main surface of the stack is a reinforced layer structure, and wherein only the at least one electrically insulating layer structure arranged at the outer main surface of the stack is the reinforced layer structure;
    a recess formed in the stack, wherein the recess is defined by the electrically insulating layer structures such that the embedded component is entirely accommodated within the recess; and
    a solder resist layer formed at an outer surface of the reinforced layer structure,
    wherein the reinforced layer structure is located between the solder resist layer and another one of the several electrically insulating layer structures.

2. The coreless component carrier as set forth in claim 1, further comprising:
    a further electrically conductive layer structure, which is formed at an outer main surface of the component carrier, wherein the further electrically conductive layer structure comprises embedded conductor traces formed within a layer of insulating material.

3. The coreless component carrier as set forth in claim 1, further comprising:
    tapering electrically conductive through connections formed in the stack and having the same tapering direction above and below the component.

4. The coreless component carrier as set forth in claim 1, wherein the embedded component extends in a vertical direction over a plurality of electrically insulating layer structures.

5. The coreless component carrier as set forth in claim 1, further comprising:
    a continuous metal structure formed below the embedded component.

6. The coreless component carrier as set forth in claim 5, wherein the continuous metal structure comprises at least one horizontal portion and/or at least one vertical portion.

7. The coreless component carrier as set forth in claim 1, wherein contact terminals of the embedded component are in direct contact with the electrically conductive layer structure.

8. The coreless component carrier as set forth in claim 1, further comprising:
    a fan out structure formed at one side of the embedded component.

9. The coreless component carrier as set forth in claim 8, further comprising:
    a further fan out structure formed at one further side of the embedded component.

10. The coreless component carrier as set forth in claim 1, further comprising:
    a fan out structure comprising a photoimageable dielectric material formed at a side of the embedded component.

11. The coreless component carrier as set forth in claim 1, wherein the stack is free of a core.

12. The coreless component carrier as set forth in claim 1, further comprising:
    at least one buildup layer formed at one side of the component.

13. The coreless component carrier as set forth in claim 12,
wherein at least one of the at least one build-up layer comprises reinforcing particles.

14. The coreless component carrier as set forth in claim 12, further comprising:
at least one further buildup layer formed at one another side of the component, wherein the one another side of the component is opposed to the one side of the component.

15. The coreless component carrier as set forth in claim 1, further comprising:
at least one further embedded component.

16. The coreless component carrier as set forth in claim 15,
wherein the embedded component and the further embedded component have different thicknesses.

17. A method for manufacturing a coreless component carrier, the method comprising:
providing a stack comprising at least one electrically conductive layer structure and several electrically insulating layer structures, the stack forming a recess defined by the electrically insulating layer structures;
embedding a component within the stack, such that the component is entirely accommodated within the recess;
wherein at least one of the electrically insulating layer structures, arranged at an outer main surface of the stack is a reinforced layer structure, and wherein only the at least one electrically insulating layer structure arranged at the outer main surface of the stack is the reinforced layer structure; and
forming a solder resist layer at an outer surface of the reinforced layer structure,
wherein the reinforced layer structure is located between the solder resist layer and another one of the several electrically insulating layer structures.

18. The method as set forth in claim 17, further comprising:
forming a further electrically conductive layer structure at an outer main surface of the component carrier, wherein the further electrically conductive layer structure comprises embedded conductor traces formed within a layer of insulating material;
wherein an embedded trace structure comprising the embedded conductor traces is formed with a detachable copper foil, wherein during formation of the embedded trace structure the detachable copper foil acts as a temporary carrier structure.

19. The method as set forth in claim 17, further comprising:
forming a continuous metal structure layer at the bottom of a cavity wherein the embedded component is to be accommodated;
wherein for forming the recess the continuous metal structure layer acts as a stop layer for electromagnetic radiation removing material from the stack.

20. The method as set forth in claim 17,
wherein the method comprises simultaneously manufacturing a further coreless component carrier by employing a temporary support structure having two opposing main surfaces, wherein the coreless component carrier is manufactured at one main surface of the two opposing main surfaces, and the further coreless component carrier is manufactured at the other main surface of the two opposing main surfaces;
wherein the method comprises at least one of the following features (a) and (b) where (a) is an intermediate processing structure comprising the coreless component carrier, the temporary support structure, and where the further coreless component carrier exhibits a symmetry with respect to a center plane of the temporary support structure; or an intermediate processing structure comprising the coreless component carrier, the temporary support structure, and where the further coreless component carrier exhibits an asymmetry with respect to a center plane of the temporary support structure;
(b) the temporary support structure comprises a release material formed at the two opposing main surfaces.

* * * * *